United States Patent [19]
Hongu et al.

[11] 3,987,317
[45] Oct. 19, 1976

[54] TRANSISTOR BIASING CIRCUIT

[75] Inventors: Masayuki Hongu, Komae; Shigeru Ohmuro; Hiromi Kawakami, Yokohama, all of Japan

[73] Assignee: Sony Corporation, Tokyo, Japan

[22] Filed: Nov. 26, 1975

[21] Appl. No.: 635,365

[30] Foreign Application Priority Data
Dec. 5, 1974  Japan.............................. 49-140179

[52] U.S. Cl.............................. 307/296; 307/254; 307/297; 330/22
[51] Int. Cl.² ...................................... H03K 17/00
[58] Field of Search .......... 307/296, 297, 254, 310; 330/22, 25

[56] References Cited
UNITED STATES PATENTS

| | | | |
|---|---|---|---|
| 3,544,882 | 12/1970 | Tanaka .............................. | 307/296 |
| 3,740,658 | 6/1973 | Loving, Jr.............................. | 330/22 |

Primary Examiner—Stanley D. Miller, Jr.
Assistant Examiner—B. P. Davis
Attorney, Agent, or Firm—Hill, Gross, Simpson, Van Santen, Steadman, Chiara & Simpson

[57] ABSTRACT

A transistor biasing circuit having a single biasing transistor for biasing first and second operational transistors. The biasing transistor has means connecting its base to its collector and means are provided to connect the base of each of the first and second operational transistors to the collector circuit of the biasing transistor. Each of the three transistors are arranged in a circuit between a pair of voltage terminals which are connected to a power supply. The arrangement of the resistors in the circuit paths of the biasing transistor and the operational transistors are in such a way as to provide circuit means for stabilizing the collector currents of the first and second transistors regardless of variations in the factor of $h_{FE}$. This circuit arrangement provides an improved stabilization of the collector currents over prior art devices.

4 Claims, 5 Drawing Figures

3,987,317

TRANSISTOR BIASING CIRCUIT

BACKGROUND OF THE INVENTION

1. Field of the Invention

The field of art to which this invention pertains is transistor biasing circuits for a pair of operational transistors wherein means are provided to minimize variation in the collector currents of the operational transistors even though there may be variations in the factor $h_{FE}$.

2. Description of the Prior Art

Prior art circuits have been developed to attempt a minimization of variation in collector currents in a transistor biasing circuit regardless of variations in the factor $h_{FE}$. However such circuits have not resulted in the kind of improvement desired in modern circuit arrangements. Accordingly the present invention deals with an improvement over such prior art circuits to further minimize the variation in collector currents of such circuits regardless of the variations in the factor $h_{FE}$.

Reference is had to related application Ser. No. 635,283 assigned to same assignee and filed on even date herewith.

SUMMARY OF THE INVENTION

It is an important feature of the present invention to provide an improved transistor biasing circuit for a pair of operational transistors.

It is another feature of the present invention to provide a transistor biasing circuit for a pair of operational transistors to minimize variations in collector currents thereof in response to variations in the factor $h_{FE}$.

It is another feature of the present invention to provide a transistor biasing circuit having a pair of transistors biased by a single biasing transistor wherein the biasing transistor has its collector connected in the circuit paths of the base circuits of each of the operational transistors and wherein the various resistance values associated with the biasing arrangements of each transistor are designed to minimize variations in collector currents in response to variations in the factor $h_{FE}$.

It is another object of the present invention to provide a transistor biasing circuit as described above wherein the transistor which precedes the biasing transistor has a gain of less than one and the transistor which follows the biasing transistor has a gain of greater than one.

It is another object of the present invention to provide a circuit arrangement as described above wherein the transistor which precedes the biasing transistor has a gain greater than one and the transistor which follows the biasing transistor has a gain greater than one.

These and other objects, features and advantages of the present invention will be understood from the drawings and the following description wherein reference numerals are utilized to designate a preferred embodiment.

DESCRIPTION OF THE PREFERRED EMBODIMENTS

The present invention relates to a transistor biasing circuit by which the bases of two transistors can be supplied with a stabilized biasing voltage under the condition of equal collector currents and different emitter resistances.

Figure 1:
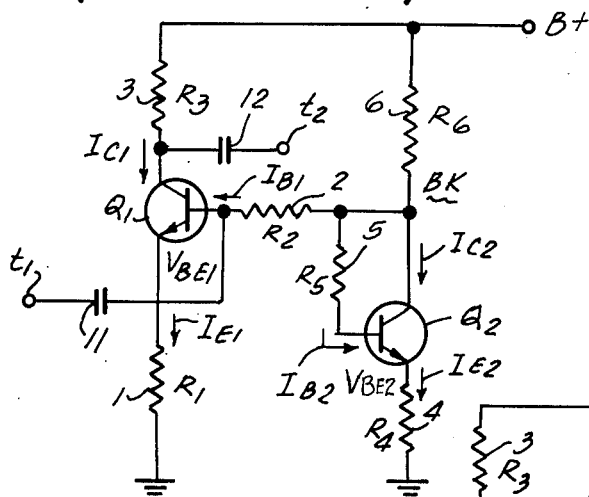
FIGS. 1 and 2 are schematics showing prior art arrangements which relate to the present invention.

In the prior art circuit as shown in FIG. 1, when the base-emitter voltage $V_{BE}$ and current amplification factor $h_{FE}$ of a biasing transistor $Q_2$ are equal to those of an amplifying transistor $Q_1$ which has a base supplied with the biasing voltage, the values of the DC collector currents of both transistors and the ratio thereof can be designed at a predetermined value, even if the factor $h_{FE}$ is varied.

Such a biasing circuit is described below with reference to FIG. 1. An amplifying transistor $Q_1$ has an emitter which is grounded through a resistor 1, a collector connected through a load resistor 3 to a power or voltage source B$^+$, and a base connected through a capacitor 17 to a signal input terminal $t_1$. An output terminal $t_2$ is available at a capacitor 12 which is connected to the collector of the transistor $Q_1$.

A biasing circuit BK, consisting of a transistor $Q_2$ and resistors 4, 5 and 6, supplies a bias voltage to the base of the transistor $Q_1$. $Q_2$ has its emitter grounded through a resistor 4, and its collector connected through a resistor 6 to the voltage source B$^+$. A resistor 5 forms a base biasing circuit between collector and base, and the collector is connected through a resistor 2 to the base of the transistor $Q_1$. The resistance values of the resistors 1 to 6 are referred to herein as $R_1$ to $R_6$; the voltages between the bases and emitters of the transistors $Q_1$ and $Q_2$, as $V_{BE1}$ and $V_{BE2}$; the DC base currents of the transistors $Q_1$ and $Q_2$, as $I_{B1}$ and $I_{B2}$; their DC collector currents as $I_{C1}$ and $I_{C2}$; and their DC emitter currents as $I_{E1}$ and $I_{E2}$, respectively.

The DC equation for voltage at the collector of the transistor $Q_2$ is as follows:

$$I_{E1}R_1 + V_{BE1} + I_{B1}R_2 = I_{E2}R_4 + V_{BE2} + I_{B2}R_5 \qquad (1)$$

In the equation (1), if it is assumed that $V_{BE1} \approx V_{BE2}$ and the factor $h_{FE}$ of each of the transistors $Q_1$ and $Q_2$ is equal, the result is the following equation (2):

$$\frac{1+h_{FE}}{h_{FE}} I_{C1}R_1 + \frac{1}{h_{FE}} I_{C2}R_2 = \frac{1+h_{FE}}{h_{FE}} I_{C2}R_4 + \frac{1}{h_{FE}} I_{C2}R_5 \qquad (2)$$

If the following equation (3) is satisfied $$I_{C1} = k\, I_{C2} \qquad (3)$$

where $k$ is a constant and the equation (2) is rearranged, the following equation (4) is derived.

$$\frac{1+h_{FE}}{h_{FE}}(k\,R_1 - R_4) + \frac{1}{h_{FE}}(k\,R_2 - R_5) = 0 \qquad (4)$$

The condition for satisfying the equation (4) regardless of variations in $h_{FE}$ is as follows:

$$k R_1 = R_4 \qquad (5)$$

$$k R_2 = R_5 \qquad (6)$$

When the resistances $R_1$, $R_2$, $R_4$ and $R_5$ are selected to satisfy the equations (5) and (6), the following equation is derived by substituting the equations (5) and (6) into the equation (2):

$$\frac{1+h_{FE}}{h_{FE}} R_1(I_{C1} - k I_{C2}) + \frac{1}{h_{FE}} R_2 (I_{C1} - k I_{C2}) =$$

$$(I_{C1} - k I_{C2}) \left( \frac{1+h_{FE}}{h_{FE}} R_1 + \frac{1}{h_{FE}} R_2 \right) = 0$$

therefore $$I_{C1} = k I_{C2} \qquad (3)$$

This means that the equation (3) is obtained. Therefore it can be said that the equation (3) is satisfied when the resistances $R_1$, $R_2$, $R_4$ and $R_5$ are selected to satisfy equations (5) and (6).

It is well known that the DC current $I_{C1}$ is temperature stabilized when the equation (3) is satisfied, and this means that the current $I_{C1}$ does not change with temperature for the reason that:

$$I_{C2} = \frac{B - V_{BE2}}{R_6 + R_4} = \frac{B}{R_6 + R_4}$$

Therefore when equation (3) is satisfied $I_{C1}$ and hence $I_{C2}$ is constant regardless of changes in $h_{FE}$.

An example where the bases of the two transistors $Q_1$ and $Q_3$ are biased by a biasing transistor $Q_2$ such as shown in FIG. 1 will be described with reference to FIG. 2 in which corresponding elements are marked with the same reference numerals as used in FIG. 1.

Figure 2:
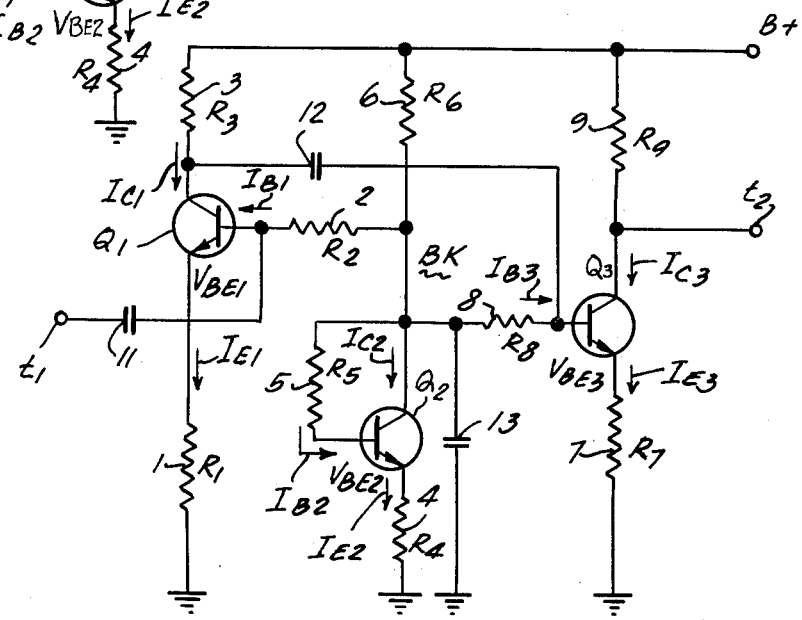
Figure 5:
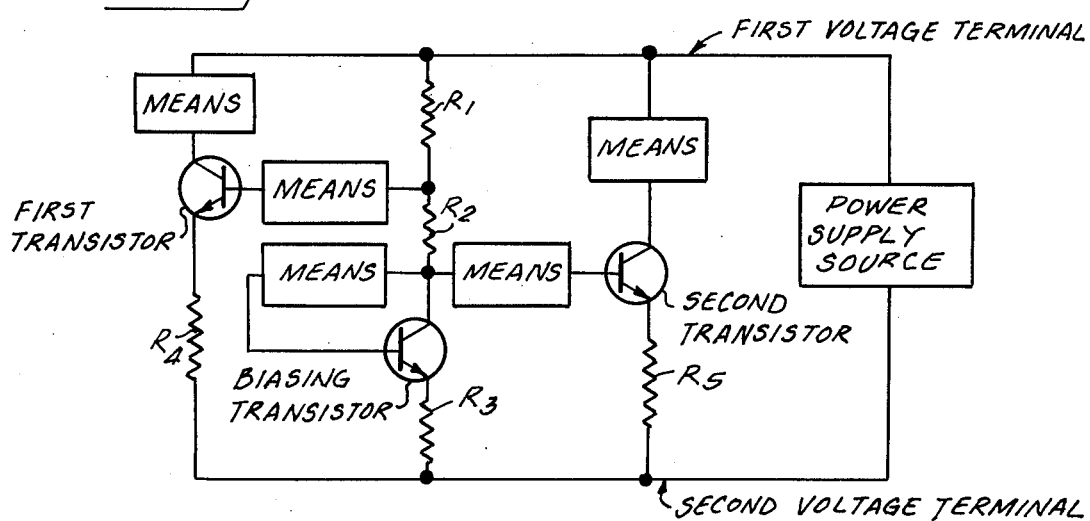
FIG. 5 is an illustrative diagram of a general circuit of the present invention having the various elements thereof identified in a manner which permits a ready application of the claims appended hereto.

In FIG. 2, reference letter $Q_3$ shows an amplifying transistor which forms another transistor amplifier, and in this case the transistor $Q_3$ is connected at the rear state of the transistor $Q_1$. The emitter of the transistor $Q_3$ is grounded through a resistor 7. Its collector is connected through a load resistor 9 to the voltage source B+, and an output terminal $t_3$ is coupled to the collector. The base of transistor $Q_3$ is connected through a capacitor 18 to the collector of the transistor $Q_1$. The collector of the transistor $Q_2$, of the biasing circuit BK, is connected through a resistor 8 to the base of the transistor $Q_3$. A capacitor 19, connected between the collector of the transistor $Q_2$ and ground prevents an input signal at the base of the transistor $Q_3$ from being fed back to the base of the transistor $Q_1$ through the resistors 8 and 2.

The resistance values of the resistors 7 to 9 are referred to herein as $R_7$ to $R_9$; the base-emitter voltage of the transistor $Q_3$ as $V_{BE3}$; its DC base current as $I_{B3}$; its DC collector current as $I_{C3}$; and its DC emitter current as $I_{E3}$. When the transistors $Q_1$ and $Q_3$ are formed, for example in a single semiconductor as an integrated circuit, the transistors $Q_1$ and $Q_3$ have substantially the same characteristics as each other. Therefore it is desirable for the collector DC currents, $I_{C1}$ and $I_{C3}$, to be stabilized at substantially the same value because the most appropriate DC operational currents of both transistors are substantially the same.

In the embodiment of FIG. 2 equations similar to (1) to (4) in the case in FIG. 1 are established, and when the resistances $R_4$, $R_5$, $R_7$ and $R_8$ are selected to satisfy the following equations (7) and (8) under the assumption of $V_{BE2} \approx V_{BE3}$, the resulting equation (9) is satisfied:

$$k R_7 = R_4 \qquad (7)$$

$$k R_8 = R_5 \qquad (8)$$

$$I_{C3} = k I_{C2} \qquad (9)$$

Accordingly, by satisfying equations (5), (6), (7) and (8), both equations (3) and (9) can be satisfied together, and both transistors $Q_1$ and $Q_3$ are stabilized with reference to ambient temperature under the condition of equal collector currents.

If transistor $Q_1$ is used as an attenuator having a gain of less than 1, then to make the dynamic range of the transistor $Q_1$ sufficiently wide, the resistance $R_1$ is selected large. It may appear unusual to use a transistor amplifier having a gain less than 1 in combination with another transistor amplifier having a high gain much greater than 1. However such a circuit construction is often used to control the total gain of the two cascaded transistor amplifiers. Usually the preceding amplifier which operates as an attenuator is a gain controlled amplifier, but the related circuit of FIG. 3 does not show any gain control means for the sake of brevity.

Figure 4:
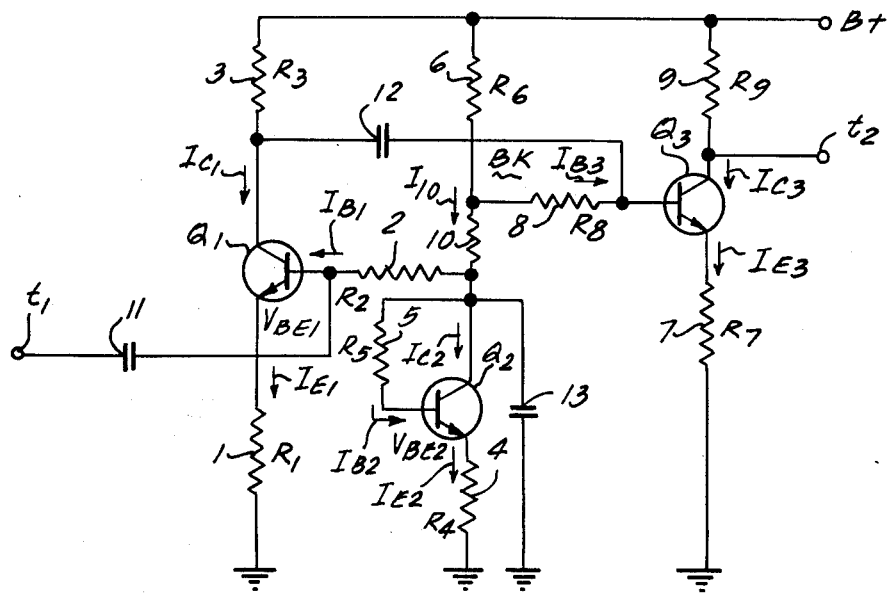
FIG. 4 is another form of the biasing circuit according to the present invention.

FIG. 4 shows another case in which each of the transistors $Q_1$ and $Q_3$ has a gain greater than 1, and the succeeding transistor $Q_3$ has a wider dynamic range than the preceding transistor $Q_1$.

Where $Q_1$ is used as an attenuator, if the gain of the transistor $Q_1$ is kept constant it is necessary to make the resistance $R_3$ great in proportion to the resistance $R_1$. It is also necessary to make the collector current $I_{C1}$ constant, and the resistances $R_2$, $R_4$ and $R_5$ are required to be great in proportion to resistance $R_1$.

If it is possible to increase the resistances $R_7$, $R_8$ and $R_9$ together in proportion to the resistance $R_1$, there may not be a problem. There may be, however, a situation where the resistance $R_9$ cannot be made sufficiently large. The reason is as follows. Since the resistance $R_9$ includes the input impedance of the following stage, namely the amplifier circuit associated with the transistor $Q_3$, which requires a low input impedance, $R_9$ cannot be made suitably large.

Accordingly, when the resistances $R_7$ and $R_8$ are selected great in proportion to $R_1$ and $R_2$ so as to make the collector DC current $I_{C3}$ constant, the AC current gain determined by the ratio ($R_9/R_7$) becomes small.

Also, if the resistance $R_7$ becomes too great, an intense thermal noise may occur. Therefore, it is not desirable to make the resistance $R_7$ great. In this case, in order to make the dynamic range of the first stage amplifier circuit wide enough, the resistance $R_1$ must be selected great regardless of the thermal noise.

There is another case where the resistance $R_1$ must be small, while the resistance $R_7$ is required to be large in order to make the gain of the transistor $Q_1$ sufficiently high and to make the dynamic range of the transistor $Q_3$ sufficiently wide. When the resistances $R_4$ and $R_5$ of the biasing circuit BK and the resistances $R_1$ and $R_2$ are selected to make the transistor $Q_1$ stabilized at the most appropriate collector current, the transistor $Q_3$ cannot be stabilized at the same collector current.

On the other hand when the resistances $R_4$ and $R_5$ of the biasing circuit BK and the resistances $R_7$ and $R_8$ are selected to make the transistor $Q_3$ stabilized at the most appropriate collector current, the transistor $Q_1$ cannot be stabilized at the same collector current.

In view of the above defects of the prior art, the present invention provides a single biasing circuit for biasing both bases of two transistors regardless of the difference of the resistance values mentioned above.

Furthermore, the present invention provides a biasing circuit by which the DC collector currents of respective transistors can be held at a desired constant value regardless of variations in the factor $h_{FE}$ by independently selecting the emitter resistances of the respective transistors.

Figure 3:
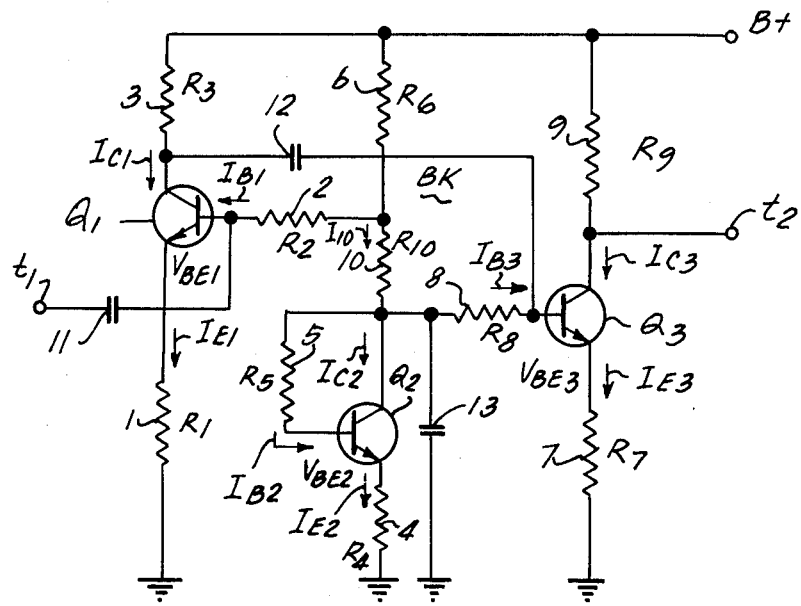
FIG. 3 is a schematic of a transistor biasing circuit according to the present invention.

In the embodiment of the present invention shown in FIG. 3, elements corresponding to those in FIGS. 1 and 2 are marked with the same reference numerals and letters and their description is omitted for simplicity.

In FIG. 3, a resistor 10 having a resistance value $R_{10}$ is connected between the junction of resistors 2 and 6 and the collector of the transistor $Q_2$, other circuit elements are substantially the same as those in FIG. 2.

If in the embodiment of FIG. 3 the resistances $R_4$, $R_5$, $R_7$ and $R_8$ are selected to satisfy the above equations (7) and (8), the equation (9) can be satisfied. In this case, it is assumed that the factor $h_{FE}$ of the transistors $Q_1$, $Q_2$ and $Q_3$ are equal with one another (which means that when they are varied, they vary equally) and the equation $V_{BE1} \approx V_{BE2} \approx V_{BE3}$ is satisfied.

If the current flowing through the resistor 10 is taken as $I_{10}$, it can be expressed by the following equation:

$$I_{10} = I_{E2} + I_{B3}$$

$$= \frac{1 + h_{FE}}{h_{FE}} I_{C2} + \frac{1}{h_{FE}} I_{C3} \quad (10)$$

The DC voltage at the connection point between the resistors 2 and 6 is expressed by the following equation:

$$I_{E1}R_1 + V_{BE1} + I_{B1}R_2 = I_{E2}R_4 + V_{BE2} + I_{B2}R_5 + I_{10}R_{10} \quad (11)$$

Since $V_{BE1} \approx V_{BE2}$, the equation (11) can be rewritten as follows:

$$\frac{1 + h_{FE}}{h_{FE}} I_{C1} R_1 + \frac{1}{h_{FE}} I_{C1} R_2 = \frac{1 + h_{FE}}{h_{FE}} I_{C2} R_4 + \frac{1}{h_{FE}} I_{C2} R_5 + I_{10} R_{10} \quad (12)$$

If the equation (10) is substituted into the right side of equation (12), the right side is expressed as follows:

$$\text{right side} = \frac{1 + h_{FE}}{h_{FE}} I_{C2} (R_4 + R_{10}) + \frac{1}{h_{FE}} I_{C2} R_5 + \frac{1}{h_{FE}} I_{C3} R_{10} \quad (13)$$

In contrast if in the circuit of the present invention as shown in FIG. 3, $R_1 = 50$ ohms, $R_2 = 5k$ ohms, $R_3 = 0$ ohm, $R_4 = 90$ ohms, $R_5 = 15k$ ohms, $R_6 = 9.1k$ ohms, $R_7 = 30$ ohms, $R_8 = 5k$ ohms, $R_9 = 0$ ohm, $R_{10} = 60$ ohms and the capacitors 12 and 13 are removed, the variation factor of the current $I_{C1}$ upon the factor $h_{FE}$ being varied from 200 to 100 is 0.00415 and that of the current $I_{C3}$ is 0.01687.

Since the third term in the expression (13) is sufficiently small as compared with the first term, the third term can be neglected, and the expression (13) or the right side of the equation (12) can be written as follows:

$$\text{right side} \approx \frac{1 + h_{FE}}{h_{FE}} I_{C2} (R_4 + R_{10}) + \frac{1}{h_{FE}} I_{C2} R_5 \quad (14)$$

Therefore, if the right side of the equation (12) is replaced by the expression (14) and the equation $I_{C1} = k\, I_{C2}$ is substituted thereinto, the equation (12) can be rewritten as follows:

$$\frac{1 + h_{FE}}{h_{FE}} \left\{ k R_1 - (R_4 + R_{10}) \right\} + \frac{1}{h_{FE}} (k R_2 - R_5) \approx 0 \quad (15)$$

The condition for satisfying equation (15) regardless of variations in the factor $h_{FE}$ is as follows:

$$k R_1 = R_4 + R_{10} \quad (16)$$

$$k R_2 = R_5 \quad (17)$$

Therefore if the resistance $R_1$, $R_2$, $R_4$, $R_5$, $R_7$, $R_8$ and $R_{10}$ are selected to satisfy equations (7), (8), (16) and (17), $I_{C1} = I_{C3} = k\, I_{C2}$ is satisfied and both the transistors $Q_1$ and $Q_3$ are stabilized under the condition of $R_1 > R_7$ with the most appropriate collector current.

If in the circuit of FIG. 2, $R_1 = 50$ ohms, $R_2 = 5k$ ohms, $R_3 = 0$ ohm, $R_4 = 150$ ohms, $R_5 = 15k$ ohms, $R_6 = 9.1k$ ohms, $R_7 = 30$ ohms, $R_8 = 9.1k$ ohms, $R_9 = 0$ ohm and the capacitors 12 and 13 are removed, the variation factor of the current $I_{C1}$ upon the factor $h_{FE}$ being varied from 200 to 100, is 0.00114 and that of the current $I_{C3}$ is 0.14223, respectively.

When the emitter resistor 1 of the preceding transistor $Q_1$ is desired to be small and the emitter resistor 7 of the following transistor $Q_3$ is desired to be great in order to make the gain of the preceding transistor $Q_1$ sufficiently high and to make the dynamic range of the transistor $Q_3$ sufficiently wide, the circuit shown in FIG. 4 is used instead of the circuit of FIG. 3. The only physical difference in the circuit of FIG. 4 as compared to FIG. 3 is that the base biasing connections for the transistors $Q_1$ and $Q_3$ are interchanged.

Therefore it can be understood that the transistors $Q_1$ and $Q_3$ of FIG. 4 operate in the same manner as the transistors $Q_3$ and $Q_1$ of FIG. 3, respectively and that the transistors $Q_1$ and $Q_3$ of FIG. 4 are stabilized under the condition of $I_{C1} = I_{C3} = k\, I_{C2}$ and $R_1 < R_7$. Accordingly, further detailed explanation is omitted.

It is understood from the explanation of FIGS. 3 and 4 that both the transistors $Q_1$ and $Q_3$ are commonly biased by a single biasing circuit BK and are stabilized under the condition of $I_{C1} = I_{C3} = k\, I_{C2}$ and $R_1 \neq R_7$.

The FIG. 3 arrangement shows a case which is less often used than the arrangement shown in FIG. 4. In FIG. 3 the gain of $Q_1$ is less than 1 and the gain of $Q_3$ is greater than 1. In that case $R_1$ is greater than $R_7$. In contrast, in the circuit of FIG. 4 of the gain of $Q_1$ is greater than 1 as well as the gain of $Q_3$ being greater than 1. In the arrangement of FIG. 4, then, $R_7$ is greater than $R_1$. This is the more common arrangement, that is, where the transistors $Q_1$ and $Q_3$ are both amplifying transistors. As indicated above, the only difference between FIG. 4 and FIG. 3 is that in FIG. 3 the base circuit of $Q_3$ is connected directly to the collector $Q_2$ and the collector circuit of the transistor $Q_1$ is connected to the collector circuit $Q_2$ through the resistor $R_{10}$. In contrast, in FIG. 4 the collector circuit $Q_3$ is connected to the collector of $Q_2$ through $R_{10}$, while the collector circuit of $Q_1$ is connected directly to the collector of transistor $Q_2$.

It will be apparent that various modifications of the present invention can be accomplished by a person skilled in the art without departing from the spirit and scope of the present invention as set forth in the appended claims.

What we claim is:

1. A transistor biasing circuit comprising: a biasing transistor having base, emitter and collector electrodes; first and second voltage terminals for being connected to a power supply source; first and second resistances serially connected between the first voltage terminal and the collector electrode of the biasing transistor; a third resistance connected between the emitter electrode of the biasing transistor and the second voltage terminal; DC current conductive means coupling the collector and base electrodes of the biasing transistor; first and second transistors, each having base, emitter and collector electrodes; fourth and fifth resistances connected between the second voltage terminal and the emitter electrodes of the first and second transistors respectively; means coupling the collector electrodes of the first and second transistors to the first voltage terminal respectively; DC current conductive means coupling the base electrode of the first transistor to a circuit point between said first and second resistances; and DC current conductive means coupling the base electrode of the second transistor to the collector electrode of the biasing transistor.

2. A transistor biasing circuit in accordance with claim 1, wherein the operational characteristics of the first and second transistors are substantially equal to each other, and wherein the resistance values $R_2$, $R_3$, $R_4$ and $R_5$ of said second, third, fourth and fifth resistors are selected to substantially satisfy the following equations:

$$k R_5 = R_3$$

$$k R_4 = R_3 + R_2$$

where $k$ is a constant.

3. A transistor biasing circuit in accordance with claim 2, wherein said current conductive means for connecting the collector and base electrodes of the biasing transistor includes a sixth resistor, said DC current conductive means coupling the base electrode of the first transistor to a circuit point between the first and second resistances includes a seventh resistance, said DC current conductive means coupling the base electrode of the second transistor to the collector electrode of the biasing transistor includes an eighth resistance, and the resistance values $R_6$, $R_7$ and $R_8$ of the sixth, seventh and eighth resistances are selected to substantially satisfy the following equation:

$$k R_7 = k R_8 = R_6$$

4. A transistor biasing circuit in accordance with claim 3, wherein said means coupling the collector electrodes of the first and second transistors to the first voltage terminal respectively includes first and second loads respectively, and said transistor biasing circuit further comprising:

A. a signal input terminal coupled to the base electrode of one of said first and second transistors;

B. means coupling the collector electrode of said one transistor to the base electrode of the other transistor, and C. signal output means connected to the collector electrode of said other transistor.

* * * * *